United States Patent
Okamoto

(10) Patent No.: US 8,141,022 B2
(45) Date of Patent: Mar. 20, 2012

(54) METHOD AND APPARATUS FOR HIERARCHICAL DESIGN OF SEMICONDUCTOR INTEGRATED CIRCUIT

(75) Inventor: Takumi Okamoto, Tokyo (JP)

(73) Assignee: NEC Corporation, Tokyo (JP)

(*) Notice: Subject to any disclaimer, the term of this patent is extended or adjusted under 35 U.S.C. 154(b) by 449 days.

(21) Appl. No.: 12/309,038

(22) PCT Filed: Jul. 5, 2007

(86) PCT No.: PCT/JP2007/000735
§ 371 (c)(1), (2), (4) Date: Jan. 5, 2009

(87) PCT Pub. No.: WO2008/004346
PCT Pub. Date: Jan. 10, 2008

(65) Prior Publication Data
US 2009/0288054 A1   Nov. 19, 2009

(30) Foreign Application Priority Data

Jul. 6, 2006 (JP) .................................. 2006-186550

(51) Int. Cl.
G06F 17/50 (2006.01)

(52) U.S. Cl. ........ 716/122; 716/110; 716/118; 716/119; 716/123

(58) Field of Classification Search ............... 716/122
See application file for complete search history.

(56) References Cited

U.S. PATENT DOCUMENTS 5,309,371 A * 5/1994 Shikata et al. ................ 716/121
2004/0103377 A1* 5/2004 Eaton et al. .................... 716/1
2006/0225015 A1* 10/2006 Synek et al. .................... 716/8

FOREIGN PATENT DOCUMENTS

| JP | 3-129754 | 6/1991 |
|---|---|---|
| JP | 3-154363 | 7/1991 |
| JP | 8-87899 | 4/1996 |
| JP | 2000-67102 | 3/2000 |
| JP | 2001-210717 | 8/2001 |
| JP | 2002-215704 | 8/2002 |
| JP | 2004-192227 | 7/2004 |
| JP | 2004-302819 | 10/2004 |
| JP | 2005-517223 | 6/2005 |
| WO | WO 02/101600 | 12/2002 |

OTHER PUBLICATIONS

Ueda et al., "Top-Down Layout for Hierarchical Custom Design", Dec. 1987, Design & Test of Computers, IEEE, vol. 4 Issue 6. pp. 22.*

* cited by examiner

*Primary Examiner* — Paul Dinh
*Assistant Examiner* — Bryce Aisaka
(74) *Attorney, Agent, or Firm* — McGinn Intellectual Property Law Group, PLLC

(57) ABSTRACT

A hierarchical design apparatus 1 for a semiconductor integrated circuit includes a hierarchical block placing unit 1-02 which places sets of hierarchical blocks onto a chip; a hierarchical block terminal placing unit 1-03 which places terminals of the hierarchical blocks so that for sets of hierarchical blocks having the same function, the hierarchical blocks coincide with each other in a coordinate of the corresponding terminal; an intra-hierarchical block layout unit 1-06 which executes the individual types of intra-hierarchical-block layout designs, meanwhile executes only a single type of intra-hierarchical-block layout design for the sets of hierarchical blocks having the same function; and a chip layout finishing unit 1-07 which replicates thus-obtained layout patterns, and thereby completing a layout design over the entire chip.

9 Claims, 10 Drawing Sheets

METHOD AND APPARATUS FOR HIERARCHICAL DESIGN OF SEMICONDUCTOR INTEGRATED CIRCUIT

TECHNICAL FIELD

The present invention relates to a method and an apparatus for designing semiconductor integrated circuit, and in particular to a method and an apparatus for hierarchical design.

BACKGROUND ART

Conventionally, in this sort of hierarchical design, having been adopted is a method of dividing a target circuit to be designed into a plurality of partial circuits (referred to as blocks, or hierarchical blocks, hereinafter), designing the individual blocks, and then integrating these blocks into one, to thereby complete the entire design. By virtue of such divide-and-conquer design, the hierarchical design technique successfully raises an effect of realizing design of a large-scale integrated circuit, which is difficult in batch processing and batch optimization, in an efficient manner, while needing only a small memory consumption and short period of time. Examples of the conventional hierarchical design device are described in Patent Document 1 and Patent Document 2 (Japanese Laid-Open Patent Publication No. 2004-192227 and Japanese Laid-Open Patent Publication No. 2004-302819).

A processing for solving a problem in the hierarchical design, based on division, will be explained referring to FIG. 8.

An example shown in FIG. 8 relates to a processing carried out in the hierarchical design of a hierarchical block 1 (8-01) and a hierarchical block 2 (8-02) having gates 8-06, wherein generation and positional determination of boundary terminals 8-03 (hierarchical block terminals) on the boundaries of the hierarchical blocks are necessary. This is a processing for allowing independent execution of an intra-hierarchical-block layout 8-04 and an inter-hierarchical-block layout (8-05). Examples of devices for placing the hierarchical block terminals are described in Patent Document 3, Patent Document 4, Patent Document 5, and Patent Document 6 (Japanese Laid-Open Patent Publication No. 2000-67102, Japanese Laid-Open Patent Publication No. 2001-210717, Japanese Laid-Open Patent Publication No. 2002-215704, and Published Japanese Translation of PCT International Publication for Patent Application No. 2005-517223).

Now, for the purpose of improving efficiency in designing, the design of large-scale circuits is realized often by repetitively using the blocks having the same function at a plurality of sites in a chip. At what point of time in the designing the plurality of blocks having the same function are independently handled as different targets of design may variable, depending on the design technique, where the conventional hierarchical design technique may representatively be classified into two categories below.

1. Bottom-Up Hierarchical Design Technique: a single type of design is applied before the intra-block layout design, and in the step of placing the blocks on a chip, a common layout pattern is replicated at the individual sites where the blocks are used. In other words, a preliminarily-designed common layout pattern is used for a plurality of functional blocks. In this case, the positions of the block terminals are determined, taking designs of place-and-route inside the blocks into consideration.

2. Top-Down Hierarchical Design Technique: a single type of design is applied before the functional or logic design, the blocks having the same function are replicated in the step of intra-block layout design, and each of which is independently designed. In other words, different layout patterns are used respectively for a plurality the functional blocks having the same function. In this case, the positions of the block terminals are determined, after the blocks are placed on a chip, taking situation around the blocks into consideration.

The bottom-up hierarchical design method will be explained referring to FIG. 9. "A1 and A2", and "B1 and B2" are sets of the functional blocks respectively having the same function.

In the bottom-up hierarchical design, in a first stage 9-03, internal layout designs are executed for every block 9-01 (hierarchical block). The internal layout designs include determination of positions of terminals 9-02 on the block boundary (hierarchical block terminals), and place-and-route determination in the block, wherein any block having internal layout design completed therein is assumed as a designed block. In this case, targets of the intra-block layout design are four blocks of A, B, C and D. Positions of the boundary input and output terminals of the individual blocks 9-01 are determined so that place-and-route design of the internal of the blocks 9-01 may be optimized.

Next, in a second stage 9-04, blocks having the same function are replicated (in this example, A is replicated to A1, A2, and B is replicated to B1, B2), the designed blocks are then placed on a chip (including determination of positions and directions of rotation), and inter-block routing 9-05 is executed there among.

Lastly, in a third stage 9-06, results of the first stage 9-03 and the second stage 9-04 are integrated, and thereby a chip layout is completed.

Next, the top-down hierarchical design will be explained referring to FIG. 10. Similarly to as in FIG. 9, "A1 and A2", and "B1 and B2" are sets of the functional blocks respectively having the same function.

In the top-down hierarchical design method, first, in a first stage 10-03, an inter-block design is carried out. More specifically, after positions of blocks 10-01 on a chip are determined, positions of boundary input and output terminals (hierarchical block terminals) 10-02 of the individual blocks are determined so that routing among the blocks 10-01 (hierarchical blocks) may be optimized, to thereby complete the inter-block routing.

Next, in a second stage 10-04, the individual blocks are designed. In this step, under a fixed condition of the boundary input and output terminals of the blocks, layout design in each block is executed. Since "A1 and A2", and "B1 and B2" are respectively differ in the positions of the input and output terminals, the same layout pattern is not adoptable to the same functional block sets. For this reason, the intra-block layout design is executed in 6 blocks of A1, A2, B1, B2, C and D.

Lastly, in a third stage 10-05, results of the first stage 10-03 and the second stage 10-04 are integrated, and thereby a chip layout is completed.

[Patent Document 1] Japanese Laid-Open Patent Publication No. 2004-192227
[Patent Document 2] Japanese Laid-Open Patent Publication No. 2004-302819
[Patent Document 3] Japanese Laid-Open Patent Publication No. 2000-67102
[Patent Document 4] Japanese Laid-Open Patent Publication No. 2001-210717
[Patent Document 5] Japanese Laid-Open Patent Publication No. 2002-215704

[Patent Document 6] Published Japanese Translation of PCT International Publication for Patent Application No. 2005-517223

DISCLOSURE OF THE INVENTION

The conventional bottom-up hierarchical design, wherein only a single type of layout design would suffice for a plurality of blocks having the same function, was advantageous in reducing labor of designing, but peripheral situations in which the individual chips are used on the chip differ from each other, and may therefore raise problems in the inter-block routing and timing design. Because positions of the boundary terminals of the blocks cannot be determined while considering positional relations of the individual blocks assumed as being integrated on one chip, problems anticipated herein may be such that, for example, length of the inter-block routing in the second stage 9-04, having been explained referring to FIG. 9, may increase, the routing may become difficult as a consequence, or interconnect delay may increase.

The conventional top-down hierarchical design method might be excellent in flexibility, because the individual blocks may independently be designed while considering peripheral situations around the individual blocks on the chip, but may raise a problem in that such need of independent design may degrade the design efficiency, for the case where a plurality of blocks having the same function are used on one chip. For example, the intra-block layout in the second stage 10-04, having been explained referring to FIG. 10, is necessarily executed for all blocks (six blocks of A1, A2, B1, B2, C and D, in the example shown in FIG. 10) including replicated block(s).

As has been described in the above, the conventional hierarchical design methods have been suffering from a problem in that the result may lack overall optimality because a problem, which should intrinsically be optimized in an integrated manner, has been divided, or a problem of degradation in the design efficiency, because even for the case where a plurality of blocks having the same function are used on one chip, the intra-block layout design is necessarily executed independently for such plurality of blocks having same function.

The present invention was conceived after considering the above-described problems inherent to the conventional techniques, wherein an objects of which is to provide a method and a device of hierarchical design, adapted to design of a semiconductor integrated circuit having a plurality of blocks with the same function used therein, and capable of solving a problem of the hierarchical design, such as loss of overall optimality as a result of division of problem, without impairing benefits of the hierarchical design characterize by needs of only a small memory consumption, and only a short period for designing.

According to the present invention, there is provided a hierarchical design method for a semiconductor integrated circuit, comprising:

placing sets of hierarchical blocks on a chip;

placing terminals of the hierarchical blocks so that for sets of hierarchical blocks having the same function, the hierarchical blocks coincide with each other in a coordinate of the corresponding terminal;

executing the individual types of intra-hierarchical-block layout designs, meanwhile executing only a single type of intra-hierarchical-block layout design for the sets of hierarchical blocks having the same function; and replicating thus-obtained layout patterns, and thereby completing a layout design over the entire chip.

As a procedure for the layout design over the entire chip, either of two following procedures, such as executing the inter-hierarchical-block layout design, followed by the intra-hierarchical-block layout design, or such as executing the intra-hierarchical-block layout design, followed by the inter-hierarchical-block layout design, may be adoptable.

A method of determining coordinates of the terminals of the hierarchical blocks, which may be adoptable herein, is a method which includes:

firstly, setting, at initial positions of the terminals of the hierarchical blocks, center coordinates of the individual hierarchical blocks or coordinates calculated based on results of temporary placement of logic gates in the individual hierarchical blocks;

generating temporary routings among the hierarchical blocks, so as to make connection among the individual initial positions of the terminals of the hierarchical blocks; and selecting points, where routes of the temporary routings cross the boundaries of the hierarchical blocks, as hierarchical block terminal positions.

The coordinates of the terminals of the sets of the hierarchical blocks having the same function may be determined by a method below. First, temporary positions of the terminals of the hierarchical blocks are determined, without considering a restriction such that coordinates of the corresponding terminals of the sets of hierarchical blocks having the same function necessarily coincide, and barycentric coordinates of the corresponding terminal sets of the sets of hierarchical blocks having the same function are determined, based on the coordinates of the temporary positions of the terminals of the hierarchical blocks. Next, routes of the temporary routings are again generated, so that the routes of the temporary routings cross the boundaries of the hierarchical blocks at positions more closer to the barycentric coordinates, and thereby the positions of the terminals of the hierarchical blocks are updated. The generation of the routes of the temporary routings and the updating of the positions of the terminals of the blocks are repeated, until coordinates of the corresponding terminals of the sets of hierarchical blocks having the same function coincide, and thereby final terminal positions are determined.

According to the present invention, there is provided also a hierarchical design apparatus for a semiconductor integrated circuit, which includes:

a unit which places sets of hierarchical blocks onto a chip;

a unit which places terminals of hierarchical blocks so that for sets of hierarchical blocks having the same function, the hierarchical blocks coincide with each other in a coordinate of the corresponding terminal;

a unit which executes the individual types of intra-hierarchical-block layout designs, meanwhile executes only a single type of intra- hierarchical-block layout design for the sets of hierarchical blocks having the same function; and a unit which replicates thus-obtained layout patterns, and thereby completing a layout design over the entire chip.

The unit completing the layout design over the entire chip may be provided with either of a unit which executes the inter-hierarchical-block layout design, followed by the individual types of intra-hierarchical-block layout designs, or a unit which executes the individual types of intra-hierarchical-block layout designs, followed by the inter-hierarchical-block layout design.

The unit which places terminals of the hierarchical blocks may include:

a unit which sets, at initial positions of the terminals of the hierarchical blocks, center coordinates of the individual hierarchical blocks or coordinates calculated based on results of temporary placement of logic gates in the individual hierarchical blocks;

a unit which generates temporary routings among the hierarchical blocks, so as to make connection among the individual initial positions of the terminals of the hierarchical blocks; and a unit which selects points, where routes of the temporary routings cross the boundaries of the hierarchical blocks, as hierarchical block terminal positions, so as to determine coordinates of the terminals of the hierarchical blocks.

The unit which executes the intra-hierarchical-block layout design may include:

a unit which determines temporary positions of the terminals of the hierarchical blocks, without considering a restriction such that coordinates of the corresponding terminals of the sets of hierarchical blocks having the same function necessarily coincide;

a unit which updates the positions of the terminals of the hierarchical blocks by determining barycentric coordinates of the corresponding terminal sets of the sets of hierarchical blocks having the same function, based on the coordinates of the temporary positions of the terminals of the hierarchical blocks, and by generating again the routes of the temporary routings so that the routes of the temporary routings cross the boundaries of the hierarchical blocks at positions more closer to the barycentric coordinates; and a unit which allows the unit of updating to repeat generation of the routes of the temporary routings and updating of the temporary positions of the terminals of the hierarchical blocks, until coordinates of the corresponding terminals of the sets of hierarchical blocks having the same function coincide, so as to determine coordinates of the terminals of the sets of hierarchical blocks having the same function.

The present invention configured as described in the above raises the effects described below.

Only a single type of intra-block layout design may be good enough to be executed commonly for the sets of hierarchical blocks having the same function, raising an effect of realizing higher efficiency of design. In addition, since an intra-block layout design pattern is produced commonly for the sets of hierarchical blocks having the same function, while considering connections around the individual functional blocks and overall situation of the layout, an effect may be obtained in that any problems anticipated in the inter-block routing and convergence of timing design may be reduced.

BRIEF DESCRIPTION OF THE DRAWINGS

The above and other objects, advantages and features described in the above will be more apparent from the following description of certain preferred exemplary embodiments taken in conjunction with the accompanying drawings.

BEST MODES FOR CARRYING OUT THE INVENTION

First Exemplary Embodiment

Figure 1:
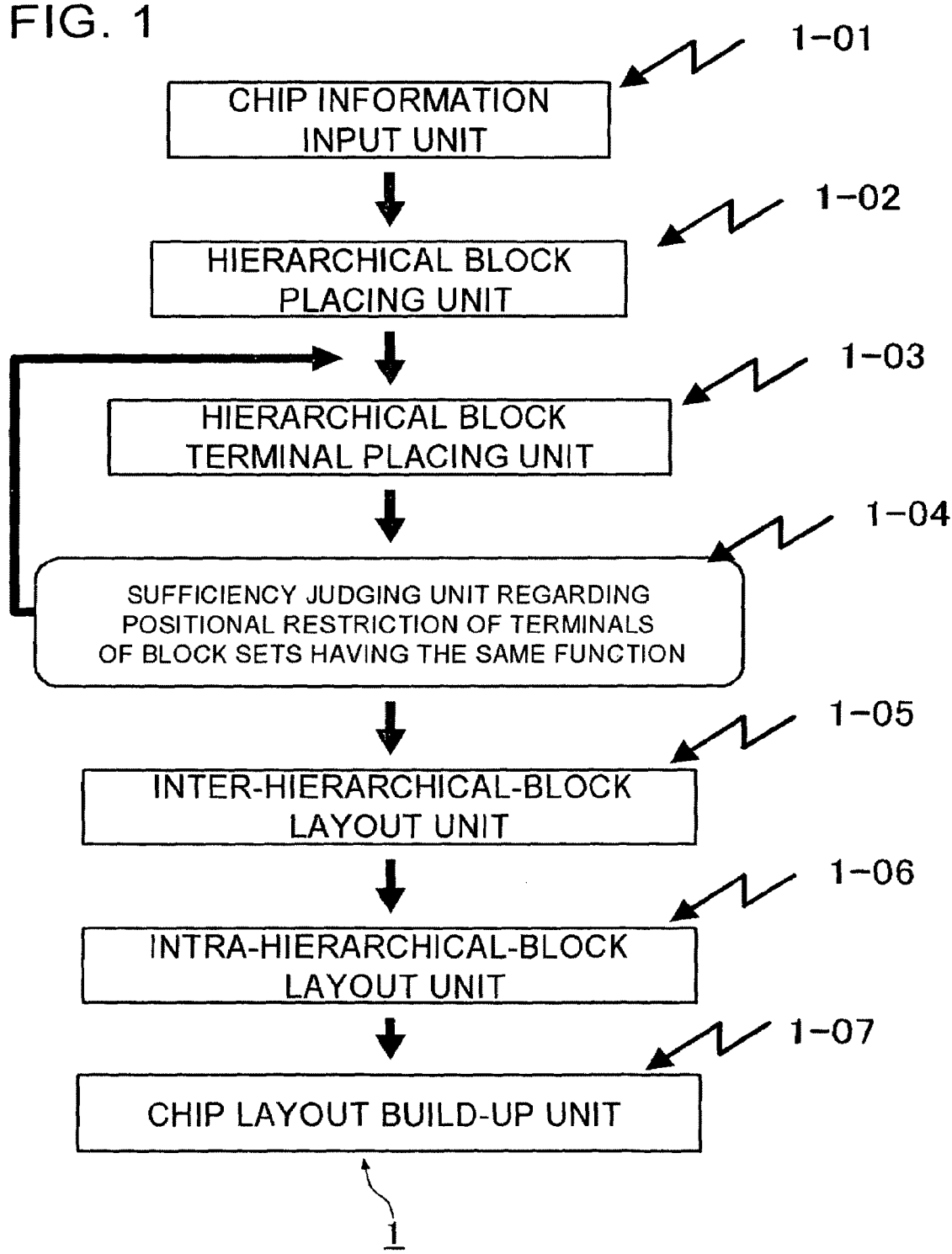
FIG. 1 is a block diagram showing a configuration of one example of a hierarchical design apparatus for a semiconductor integrated circuit according to an exemplary embodiment of the present invention.

Next, an exemplary embodiment of the present invention will be detailed referring to the drawings.

FIG. 1 is a drawing showing a configuration, as combined with operations, of a hierarchical design apparatus for a semiconductor integrated circuit according to an exemplary embodiment of the present invention.

A hierarchical design apparatus 1 of a semiconductor integrated circuit according to the exemplary embodiment of the present invention has a unit which places sets of hierarchical blocks onto a chip (hierarchical block placing unit 1-02); a unit which places terminals of the hierarchical blocks so that for sets of hierarchical blocks having the same function, the hierarchical blocks coincide with each other in a coordinate of the corresponding terminal (hierarchical block terminal placing unit 1-03); a unit which executes the individual types of intra-hierarchical-block layout designs, meanwhile executes only a single type of intra-hierarchical-block layout design for the sets of hierarchical blocks having the same function (sufficiency judging unit 1-04 regarding positional restriction of terminals of block sets having the same function, and intra-hierarchical-block layout unit 1-06); and a unit which replicates thus-obtained layout patterns, and thereby completing a layout design over the entire chip (inter-hierarchical-block layout unit 1-05, intra-hierarchical-block layout unit 1-06, and chip layout build-up unit 1-07). The hierarchical design apparatus 1 of a semiconductor integrated circuit of this exemplary embodiment further has a unit which executes, after completion of the individual types of intra-hierarchical-block layout designs, an inter-hierarchical-block layout design, and thereby completing the layout design over the entire chip (inter-hierarchical-block layout unit 1-05, intra-hierarchical-block layout unit 1-06, chip layout build-up unit 1-07).

As shown in FIG. 1, the hierarchical design apparatus 1 of a semiconductor integrated circuit of this exemplary embodiment is composed of a chip information input unit 1-01, the hierarchical block placing unit 1-02, the hierarchical block terminal placing unit 1-03, the sufficiency judging unit 1-04 regarding positional restriction of terminals of block sets having the same function, the inter-hierarchical-block layout unit 1-05, the intra-hierarchical-block layout unit 1-06, and the chip layout build-up unit 1-07. The hierarchical design apparatus 1 of a semiconductor integrated circuit of this exemplary embodiment, or each of hierarchical design apparatuses of a semiconductor integrated circuit of the individual exemplary embodiments described later is configured by a general computer composed of a control device, a memory device, an input device and a display device. These portions will not be illustrated. The individual units described in the above are controlled by the control device operated by a program stored in the memory device, while being constructed on the memory device such as ROM, RAM and so forth.

The individual units operate as schematically explained below.

The chip information input unit 1-01 inputs information, relevant to a gate level net list and hierarchical configuration of a target chip to be designed, to a memory device.

The hierarchical block placing unit 1-02 places the sets of hierarchical blocks, produced by compiling the gate level net list according to the hierarchical configuration information thereof, on a chip.

The hierarchical block terminal placing unit 1-03 places the terminals of the hierarchical blocks on the block boundaries.

The sufficiency judging unit 1-04 regarding positional restriction of terminals of block sets having the same function judges whether the corresponding terminals of the hierarchical blocks of a plurality of sets of hierarchical blocks having the same function are placed at the same positions on all of the same types of hierarchical blocks, or not. If the corresponding terminals of the same type of hierarchical blocks were judged as being not placed at the same position, the hierarchical block terminal placing unit 1-03 executes terminal placement again. These processes are repeated until the corresponding terminal positions of the same type of hierarchical blocks coincide. After the corresponding terminal positions of the same type of hierarchical blocks coincide, the inter-hierarchical-block layout unit 1-05 in the next stage executes inter-hierarchical-block layout.

The inter-hierarchical-block layout unit 1-05 generates routes of routings connecting the terminals of the hierarchical blocks, while fixing positions of the terminals of the hierarchical blocks.

The intra-hierarchical-block layout unit 1-06 executes the individual types of intra-hierarchical-block placement and routing, while fixing positions of the terminals of the hierarchical blocks.

The chip layout build-up unit 1-07 integrates the inter-hierarchical-block layout and the intra-hierarchical-block layout, to thereby complete a chip layout design.

Figure 2:
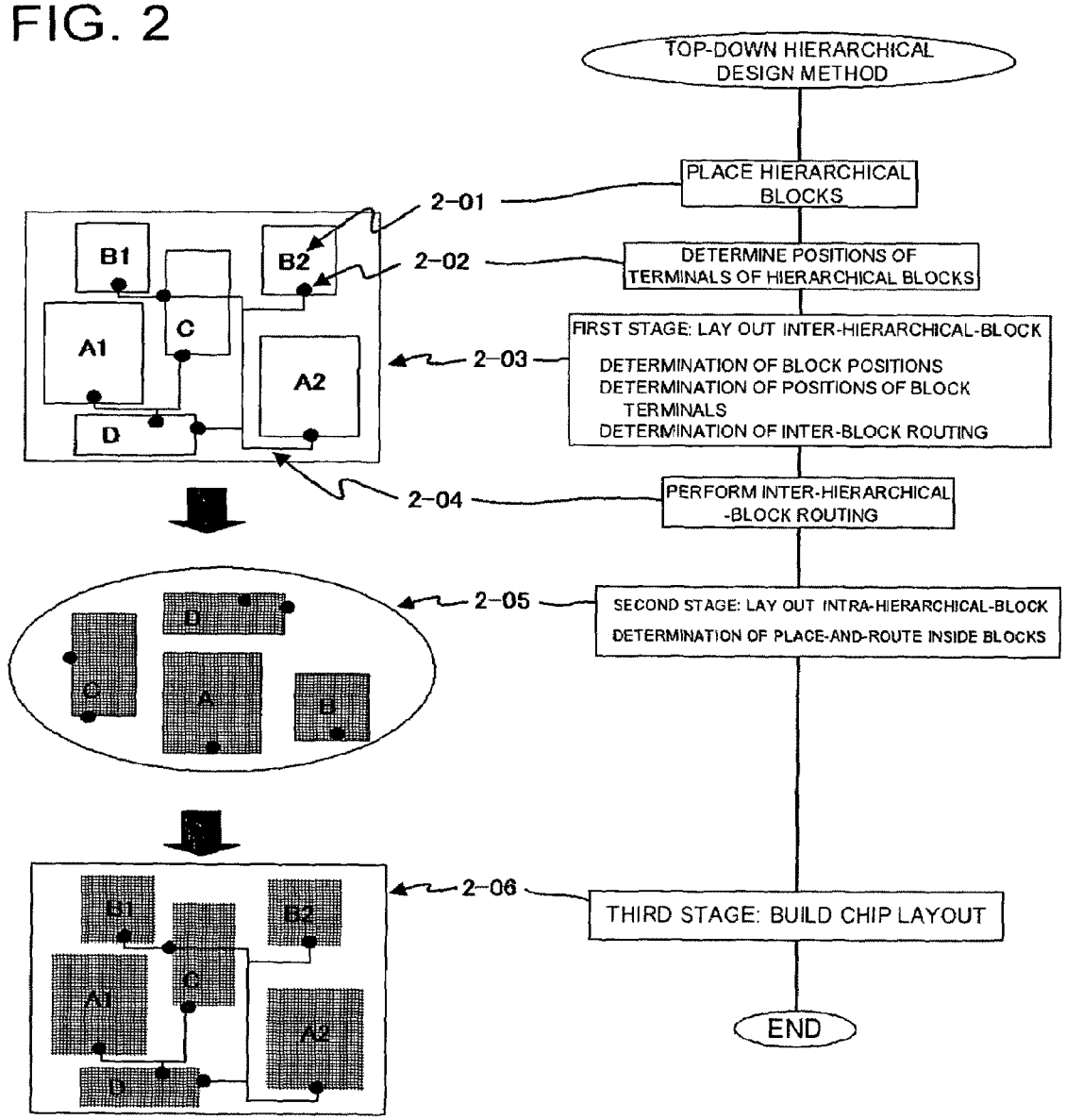
FIG. 2 is a drawing showing operations of the hierarchical design apparatus for a semiconductor integrated circuit shown in FIG. 1.

Operations of the hierarchical design apparatus 1 of a semiconductor integrated circuit according to this exemplary embodiment are shown in FIG. 2.

The hierarchical design method of a semiconductor integrated circuit according to this exemplary embodiment, comprising: placing sets of hierarchical blocks on a chip (2-01), placing terminals of the hierarchical blocks so that for sets of hierarchical blocks having the same function, the hierarchical blocks coincide with each other in a coordinate of the corresponding terminal (2-02), executing the individual types of intra-hierarchical-block layout designs, meanwhile executing only a single type of intra-hierarchical-block layout design for the sets of hierarchical blocks having the same function, and replicating the obtained layout patterns to thereby complete a layout design over the entire chip. Further in the hierarchical design method of a semiconductor integrated circuit according to this exemplary embodiment, the inter-hierarchical-block layout design (2-03) is followed by the individual types of intra-hierarchical-block layout designs (2-05), and thereby a layout design over the entire chip is completed (2-06).

In FIG. 2, "A1 and A2", and "B1 and B2" are sets of hierarchical blocks respectively having the same function. First, in the first stage (2-03), the hierarchical block placing unit 1-02 places the sets of hierarchical blocks A1, A2, B1, B2, C and D on a chip (2-01). Next, the hierarchical block terminal placing unit 1-03 determines positions of the terminals of the individual hierarchical blocks, while considering acceptability of routings among the blocks and timing (2-02). In this process, by the sufficiency judging unit 1-04 regarding positional restriction of terminals of block sets having the same function, whether the corresponding terminals of the hierarchical blocks of a plurality of sets of hierarchical blocks having the same function are placed at the same positions on all of the same types of hierarchical blocks, or not, is judged. If the corresponding terminals of the same type of hierarchical blocks were consequently judged as being not placed at the same position, the terminal placement is executed again by the hierarchical block terminal placing unit 1-03. The placement of the block terminals is repeated for the block terminals of "A1 and A2", and "B1 and B2", until positions of the terminals coincide. Next, the inter-hierarchical-block layout unit 1-05 generates routes of routings connecting among the blocks, while fixing the block terminal positions determined in the above (2-04).

Next, in the second stage, the intra-hierarchical-block layout unit 1-06 executes the intra-block layout (2-05). In this process, only a single type of common layout design pattern A or B may be good enough to be produced respectively for "A1 and A2" or "B1 and B2" having the same function. It is no more necessary to produce four types of layout design patterns for A1, A2, B1 and B2, because in the inter-hierarchical-block layout in the first stage (2-03), the block terminal positions are determined so that the terminal positions of "A1 and A2", and "B1 and B2" coincide. Lastly, in the third stage, the chip layout build-up unit 1-07 integrates the inter-block layout and the intra-block layout, to thereby complete the chip design (2-06). In this process, the intra-block layout pattern A is replicated to A1, A2, and the intra-block layout pattern B is replicated to B1, B2, and are then integrated on the chip.

Second Exemplary Embodiment

Figure 3:
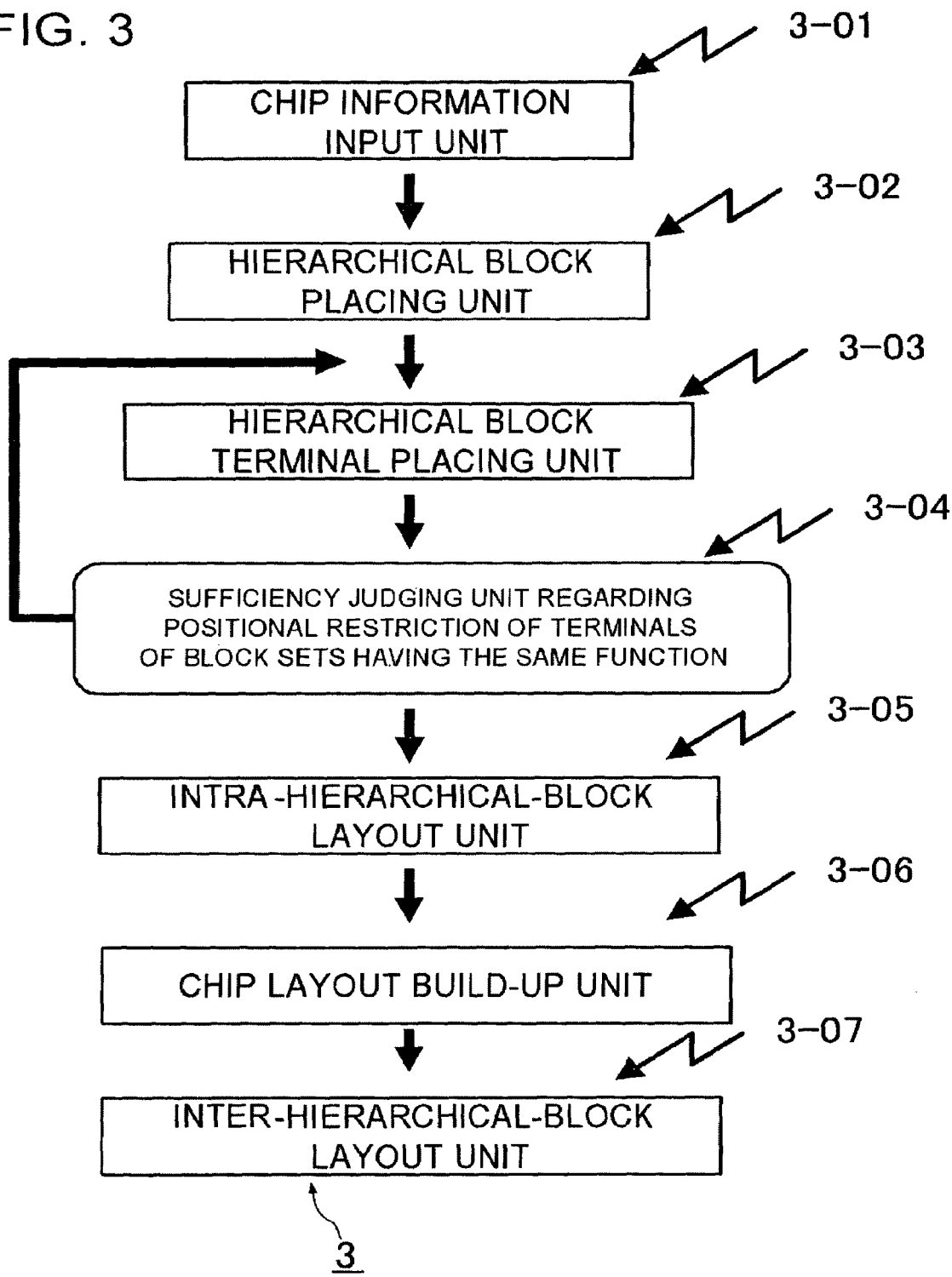
FIG. 3 is a block diagram showing a configuration of another example of a hierarchical design apparatus for a semiconductor integrated circuit according to an exemplary embodiment of the present invention.

FIG. 3 is a drawing showing a configuration, as combined with operations, of a hierarchical design apparatus for a semiconductor integrated circuit according to another exemplary embodiment of the present invention.

Details of operations of the individual units are same as those in an example shown in FIG. 1, except that the order of adoption of the inter-hierarchical-block layout and the intra-hierarchical-block layout differ there from. A hierarchical design apparatus 3 of a semiconductor integrated circuit of this exemplary embodiment has a unit which places sets of hierarchical blocks on a chip (hierarchical block placing unit 3-02), a unit which places terminals of the hierarchical blocks so that for sets of hierarchical blocks having the same function, the hierarchical blocks coincide with each other in a coordinate of the corresponding terminal (hierarchical block terminal placing unit 3-03); a unit which executes the individual types of intra-hierarchical-block layout designs, meanwhile executes only a single type of intra-hierarchical-block layout design for the sets of hierarchical blocks having the same function (sufficiency judging unit 3-04 regarding positional restriction of terminals of block sets having the same function, and intra-hierarchical-block layout unit 3-05); and a unit which replicates thus-obtained layout patterns, and thereby completing a layout design over the entire chip (intra-hierarchical-block layout unit 3-05, chip layout build-up unit 3-06, and inter-hierarchical block layout unit 3-07). The hierarchical design apparatus 3 of a semiconductor integrated circuit of this exemplary embodiment further has a unit which executes, after completion of the individual types of intra-hierarchical-block layout designs, an inter-hierarchical-block layout design, and thereby completing a layout design over the entire chip (intra-hierarchical-block layout unit 3-05, chip layout build-up unit 3-06, inter-hierarchical-block layout unit 3-07).

In short, in FIG. 3, the individual types of intra-hierarchical-block layout are executed first (intra-hierarchical-block layout unit 3-05), the chip layout is then built up (chip layout build-up unit 3-06), and the inter-hierarchical-block layout is executed (inter-hierarchical-block layout unit 3-07).

Figure 4:
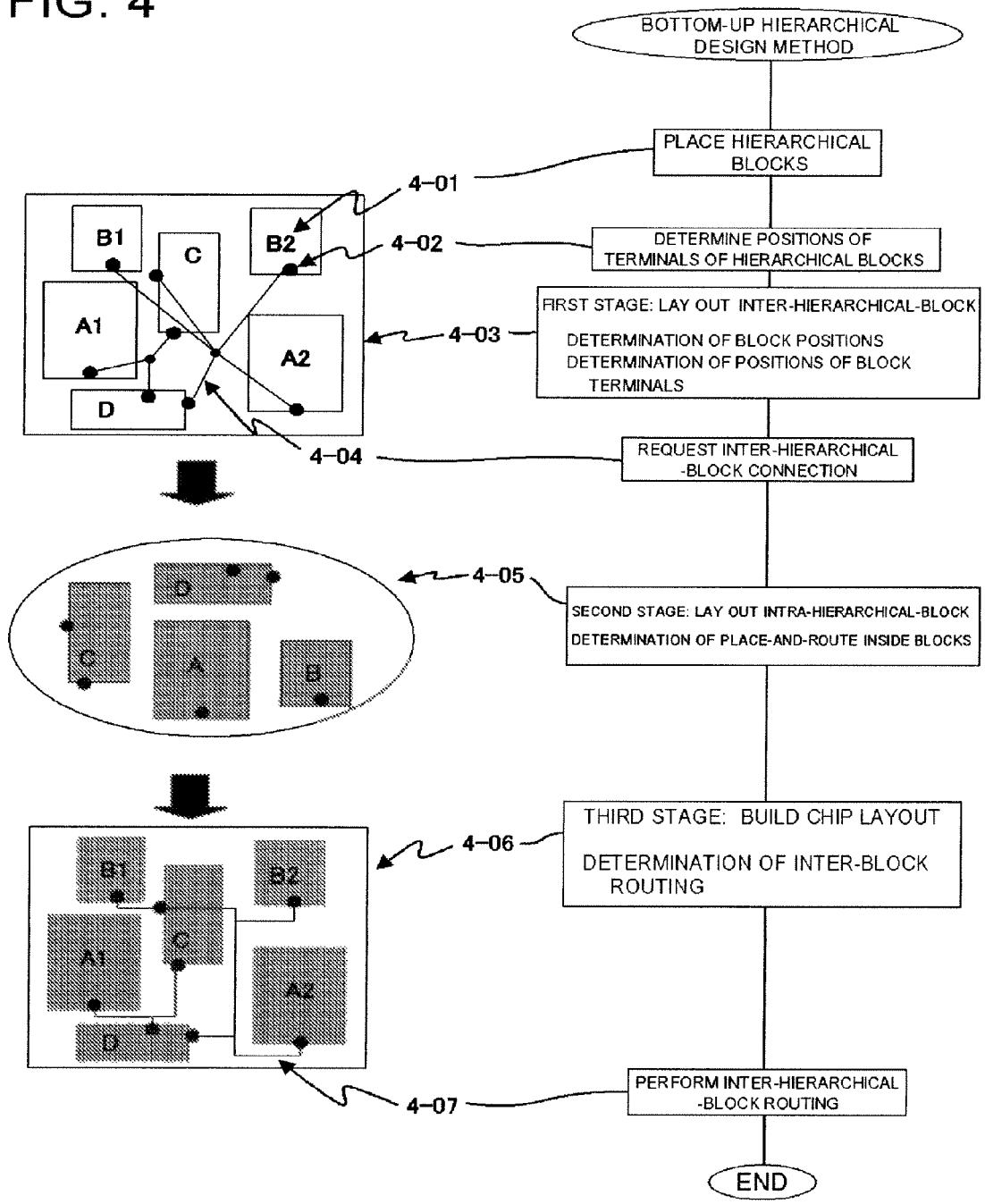
FIG. 4 is a drawing showing operations of the hierarchical design apparatus for a semiconductor integrated circuit shown in FIG. 3.

Operations of the hierarchical design apparatus 3 for a semiconductor integrated circuit are shown in FIG. 4.

The hierarchical design method of a semiconductor integrated circuit of this exemplary embodiment, comprising: placing sets of hierarchical blocks onto a chip (4-01), placing terminals of the hierarchical blocks, so that for sets of hierarchical blocks having the same function, the hierarchical blocks coincide with each other in a coordinate of the corresponding terminal (4-02), executing the individual types of intra-hierarchical-block layout designs, meanwhile executing only a single type of intra-hierarchical-block layout design for the sets of hierarchical blocks having the same function, and replicating the obtained layout patterns to thereby complete a layout design over the entire chip. Further in the hierarchical design method of a semiconductor integrated circuit according to this exemplary embodiment, the individual types of intra-hierarchical-block layout design (4-05) are followed by the inter-hierarchical-block layout design (4-06), and thereby a layout design over the entire chip is completed (4-07).

In FIG. 4, "A1 and A2", and "B1 and B2" are sets of hierarchical blocks respectively having the same function. First, in the first stage (4-03), the hierarchical block placing unit 3-02 places the sets of hierarchical blocks A1, A2, B1, B2, C and D on a chip (4-01). Next, the hierarchical block terminal placing unit 3-03 determines positions of the terminals of the individual hierarchical blocks, while considering acceptability of routings among the blocks and timing (4-02). In this process, by the sufficiency judging unit 3-04 regarding positional restriction of terminals of block sets having the same function, whether the corresponding terminals of the hierarchical blocks of a plurality of sets of hierarchical blocks having the same function are placed at the same positions on all of the same types of hierarchical blocks, or not, is judged. If the corresponding terminals of the same type of hierarchical blocks were consequently judged as being not placed at the same position, the terminal placement is executed again by the hierarchical block terminal placing unit 3-03. The placement of the block terminals is repeated for the block terminals of "A1 and A2", and "B1 and B2", until positions of the terminals coincide. Up to this stage, the inter-hierarchical-block routings are not produced yet in response to an inter-hierarchical-block connecting request (4-04). Production of the inter-hierarchical-block routings takes place, in response to the inter-hierarchical-block connection request (4-04), by the inter-hierarchical-block layout unit 3-07 in the final stage.

Next, in the second stage, the intra-hierarchical-block layout unit 3-05 executes the intra-block layout (4-05). In this process, only a single type of common layout design pattern A or B may be good enough to be produced respectively for "A1 and A2" or "B1 and B2" having the same function. It is no more necessary to produce four types of layout design patterns for A1, A2, B1 and B2, because in the inter-hierarchical-block layout (4-03), the block terminal positions are determined so that the terminal positions of "A1 and A2", and "B1 and B2" coincide. Next, in the third stage, the chip layout build-up unit 3-06 expands the intra-block layout over the chip (4-06). In this process, the block layout A is replicated to A1, A2, and the intra-block layout pattern B is replicated to B1, B2, and are expanded onto the chip. Lastly, the inter-hierarchical-block layout unit 3-07 produces routes of routings connecting the blocks (4-07), to thereby complete a chip design.

Third Exemplary Embodiment

Next, an exemplary embodiment of a hierarchical block terminal placing unit 5 will be explained referring to FIG. 5, FIG. 6 and FIG. 7. The exemplary embodiment will detail the hierarchical block terminal placing unit 1-03 and sufficiency judging unit 1-04 regarding positional restriction of terminals of block sets having the same function shown in FIG. 1, and, the hierarchical block terminal placing unit 3-03 and sufficiency judging unit 3-04 regarding positional restriction of terminals of block sets having the same function shown in FIG. 3.

In the hierarchical design apparatus of a semiconductor integrated circuit of this exemplary embodiment, the unit which places terminals of the hierarchical blocks (hierarchical block terminal placing units 1-03, 3-03) has a unit which sets, at initial positions of the terminals of the hierarchical blocks, center coordinates of the individual hierarchical blocks or coordinates calculated based on results of temporary placement of logic gates in the individual hierarchical blocks (initial terminal position generating unit 5-02), a unit which generates temporary routings among the hierarchical blocks, so as to make connection among the individual initial positions of the terminals of the hierarchical blocks (route search unit 5-05), and a unit which selects points, where routes of the temporary routings cross the boundaries of the hierarchical blocks, as hierarchical block terminal positions (provisional decision unit 5-06 for position of hierarchical block terminals), and thereby determines coordinates of the terminals of the hierarchical blocks.

In the hierarchical design apparatus of a semiconductor integrated circuit of this exemplary embodiment, the unit which executes the intra-hierarchical-block layout design (sufficiency judging unit 1-04 regarding positional restriction of terminals of block sets having the same function, 3-04, intra-hierarchical-block layout units 1-06, 3-05) further includes a unit (not shown) which determines temporary positions of the terminals of the hierarchical blocks, without considering a restriction such that coordinates of the corresponding terminals of the sets of hierarchical blocks having the same function necessarily coincide; a unit (not shown) which updates the positions of the terminals of the hierarchical blocks by determining barycentric coordinates of the corresponding terminal sets of the sets of hierarchical blocks having the same function, based on the coordinates of the temporary positions of the terminals of the hierarchical blocks, and by generating again the routes of the temporary routings so that the routes of the temporary routings cross the boundaries of the hierarchical blocks at positions more closer to the barycentric coordinates; and, a unit (not shown) which allows the unit of updating to repeat generation of the routes of the temporary routings and updating of the temporary positions of the terminals of the hierarchical blocks, until coordinates of the corresponding terminals of the sets of hierarchical blocks having the same function coincide, and thereby determines the coordinates of the terminals of the sets of hierarchical blocks having the same function.

Figure 5:
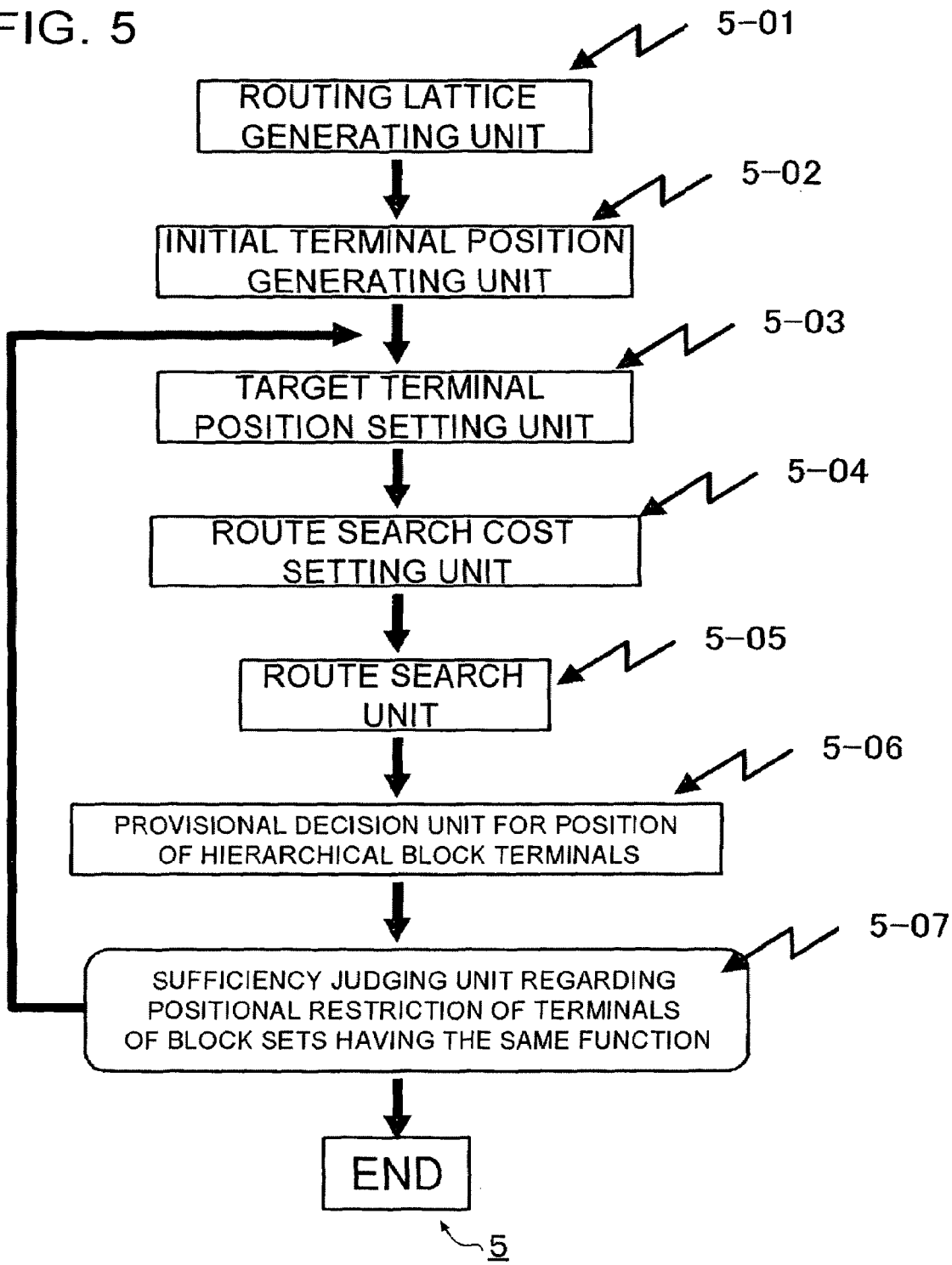
FIG. 5 is a block diagram showing a configuration of a hierarchical block terminal placing unit of the hierarchical design apparatus for a semiconductor integrated circuit according to an exemplary embodiment of the present invention.

The hierarchical block terminal placing unit 5 is configured, as shown in FIG. 5, by a routing lattice generating unit 5-01, an initial terminal position generating unit 5-02, a target terminal position setting unit 5-03, a route search cost setting unit 5-04, a route search unit 5-05, a provisional decision unit 5-06 for position of hierarchical block terminals, and a sufficiency judging unit 5-07 regarding positional restriction of terminals of block sets having the same function.

The individual units operate as schematically explained below.

The routing lattice generating unit 5-01 generates a routing lattice for searching route of interconnect, so as to cover the entire portion of the chip.

The initial terminal position generating unit 5-02 sets, at the initial terminal positions, center coordinates of the individual hierarchical blocks or coordinates calculated based on results of temporary placement of logic gates in the hierarchical blocks.

The target terminal position setting unit 5-03 sets target positions for positions of placement of the same terminals of the hierarchical blocks having the same function. Processing shown in FIG. 5 is repeated until the positions of the same terminals of the hierarchical blocks having the same function coincide, wherein the target positions of the terminals are set based on the latest results of placement of the terminals. The target positions of the terminals will not be set, if the latest results of placement of the terminals are not available.

The route search cost setting unit 5-04 sets a penalty given corresponding to distance between the target positions of the terminals and the terminal positions, when the terminal positions determined by the procedures thereafter differ from the target terminal positions determined by the target terminal position setting unit 5-03. The processing shown in FIG. 5 is repeated until the positions of the same terminals of the same functional blocks coincide, wherein a larger value will be set to the penalty, as the number of times of repetition increases, or as the difference between the target terminal positions and the terminal positions remains larger.

The route search unit 5-05 moves the initial terminal position to an intersection of the lattice closest to the position determined by 5-02, and searches a path between the terminals along the routing lattice. In this process of route searching for a net to be connected to the same terminals of the hierarchical blocks having the same function, the route search is executed, while considering the penalty set by the route search cost setting unit 5-04, so that the route of interconnect may cross the block boundary at a position closer to the target terminal position set by the target terminal position setting unit 5-03.

The provisional decision unit 5-06 for position of hierarchical block terminals temporarily determines points, where the routes determined by the route search unit 5-05 cross the boundaries of the hierarchical blocks, as block terminal positions.

With respect to the terminal positions determined by the provisional decision unit 5-06 for position of hierarchical block terminals, and with respect to a plurality of hierarchical blocks having the same function, the sufficiency judging unit 5-07 regarding positional restriction of terminals of block sets having the same function judges whether the corresponding terminals of the blocks are placed at the same positions on all of the same types of hierarchical blocks, or not. If the corresponding terminals of the blocks were consequently judged as being not placed at the same position, the target terminal positions and the route search cost are set again, and the block terminal positions are determined by the inter-block route search. The route search cost is composed of the above-described penalty for making coincidence of the same terminals of the blocks having the same function, and length-of-route cost for minimizing the length of route. The length-of-route cost is set larger as the length of route increases. This processing is repeated until the terminal positions of the same types of hierarchical blocks coincide. Upon coincidence of the terminal positions of the same types of the hierarchical blocks, the processing for placing the terminals comes to the end.

Figure 6:
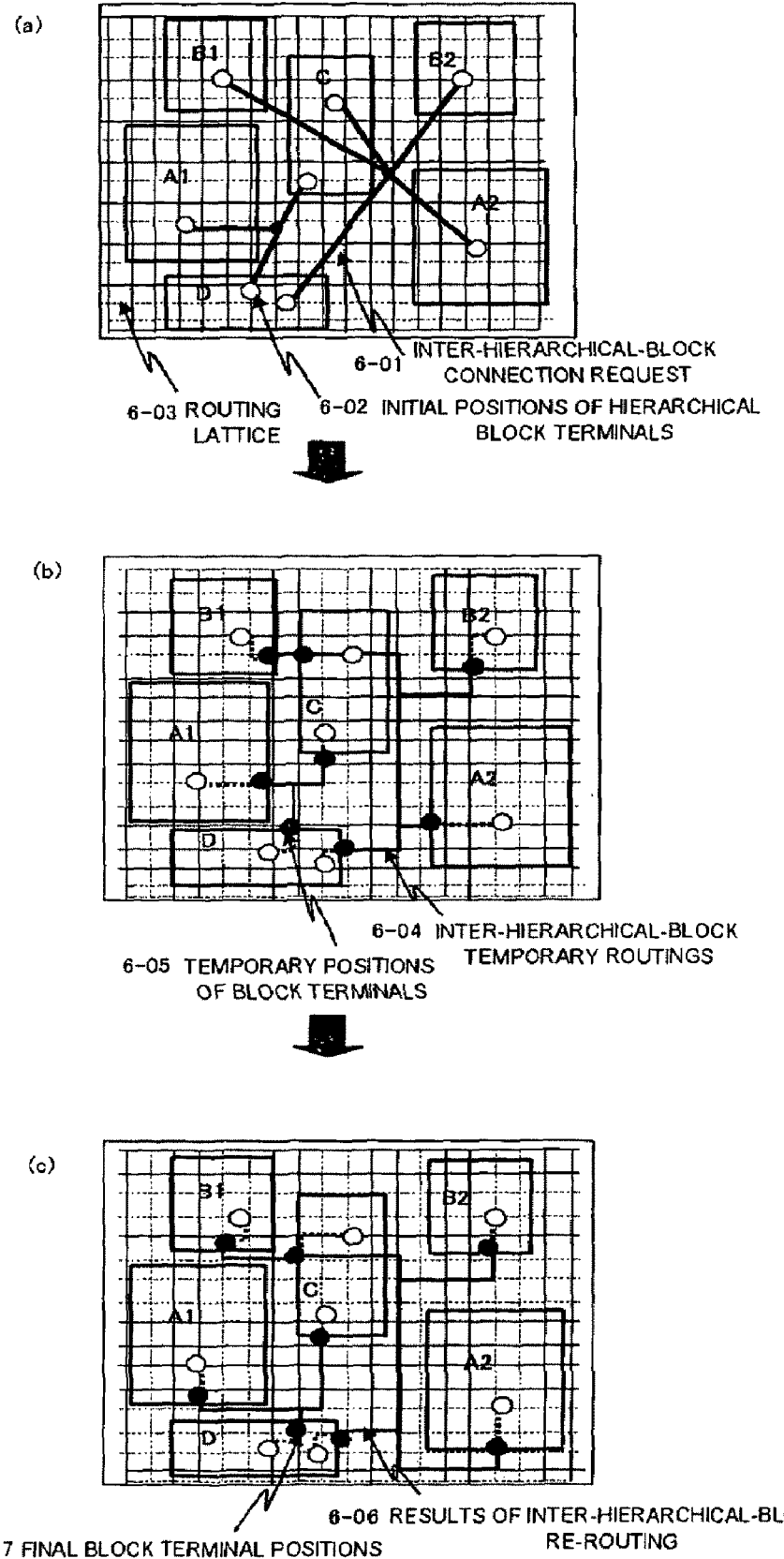
FIG. 6 is a drawing showing operations of the hierarchical block terminal placing unit shown in FIG. 5.
Figure 7:
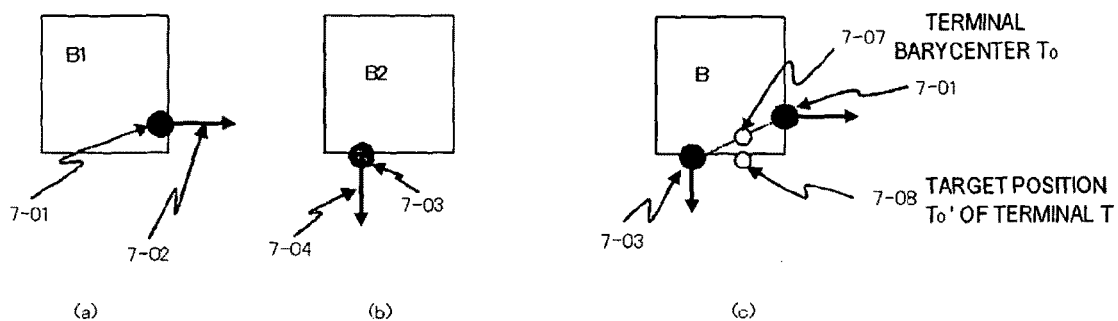
FIG. 7 is a drawing showing a processing executed by the hierarchical block terminal placing unit shown in FIG. 5, for making positions of the same terminals of the same functional blocks coincide with each other.
Figure 8:
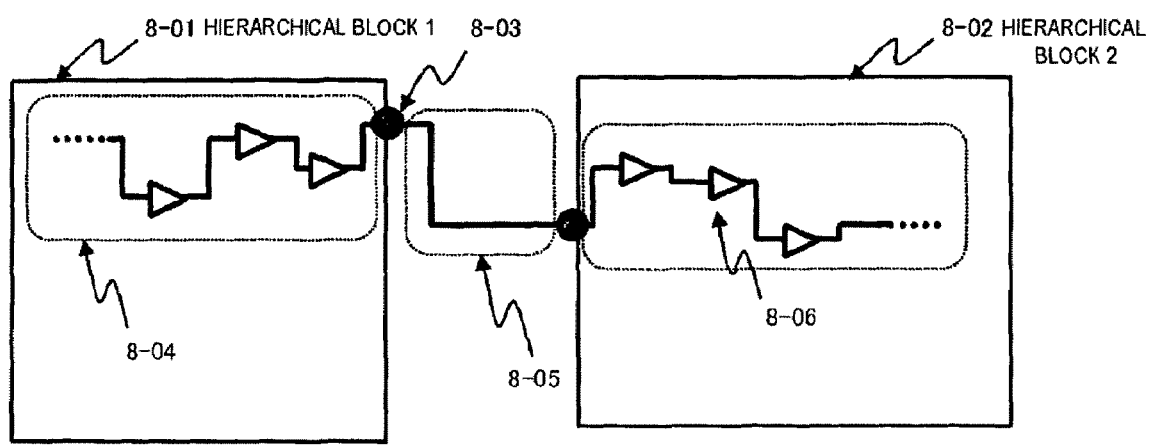
FIG. 8 is a drawing showing generation and positional determination of block boundary terminals in a conventional hierarchical design apparatus.
Figure 9:
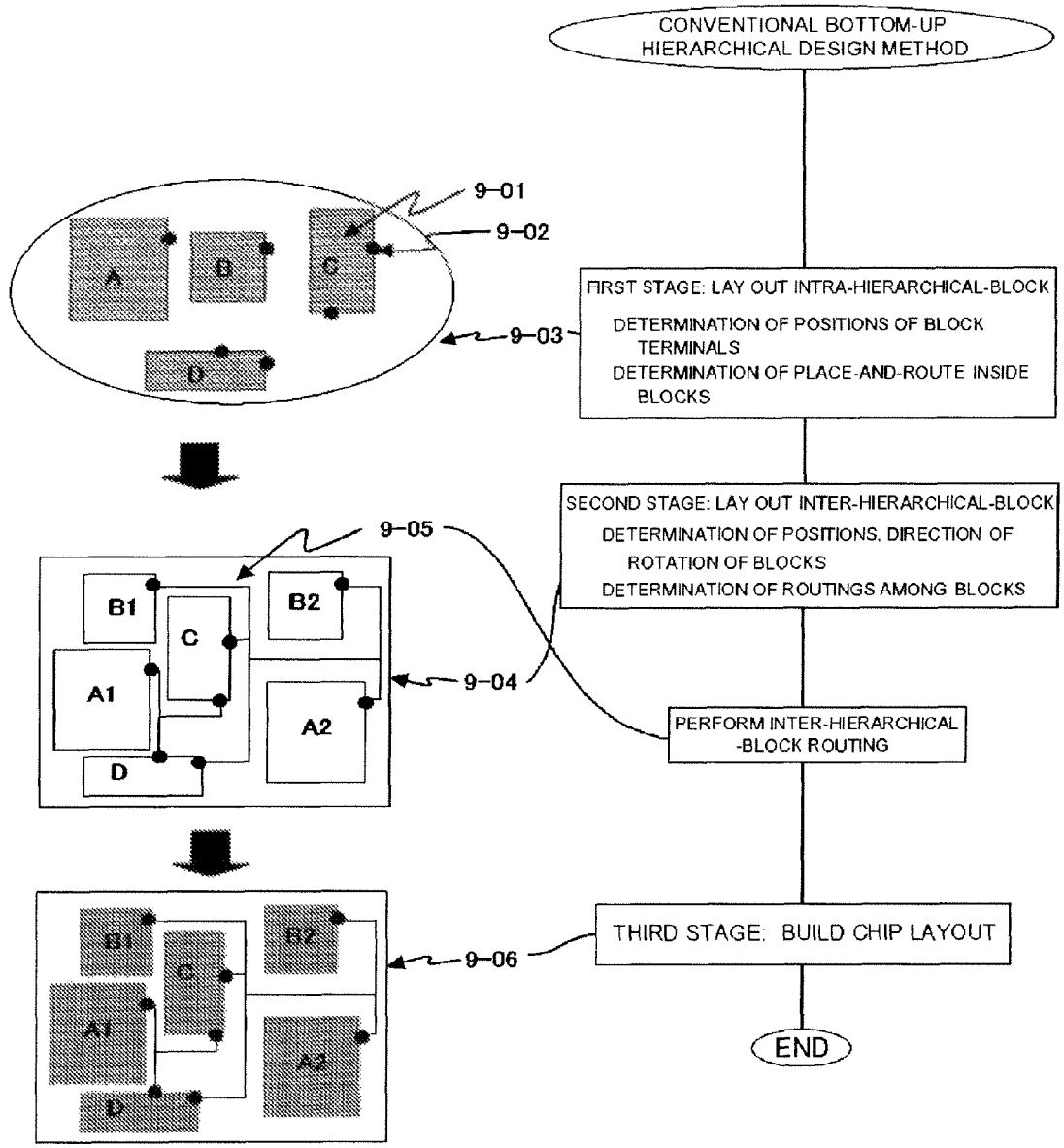
FIG. 9 is a drawing showing a bottom-up hierarchical design method, one of the conventional techniques.
Figure 10:
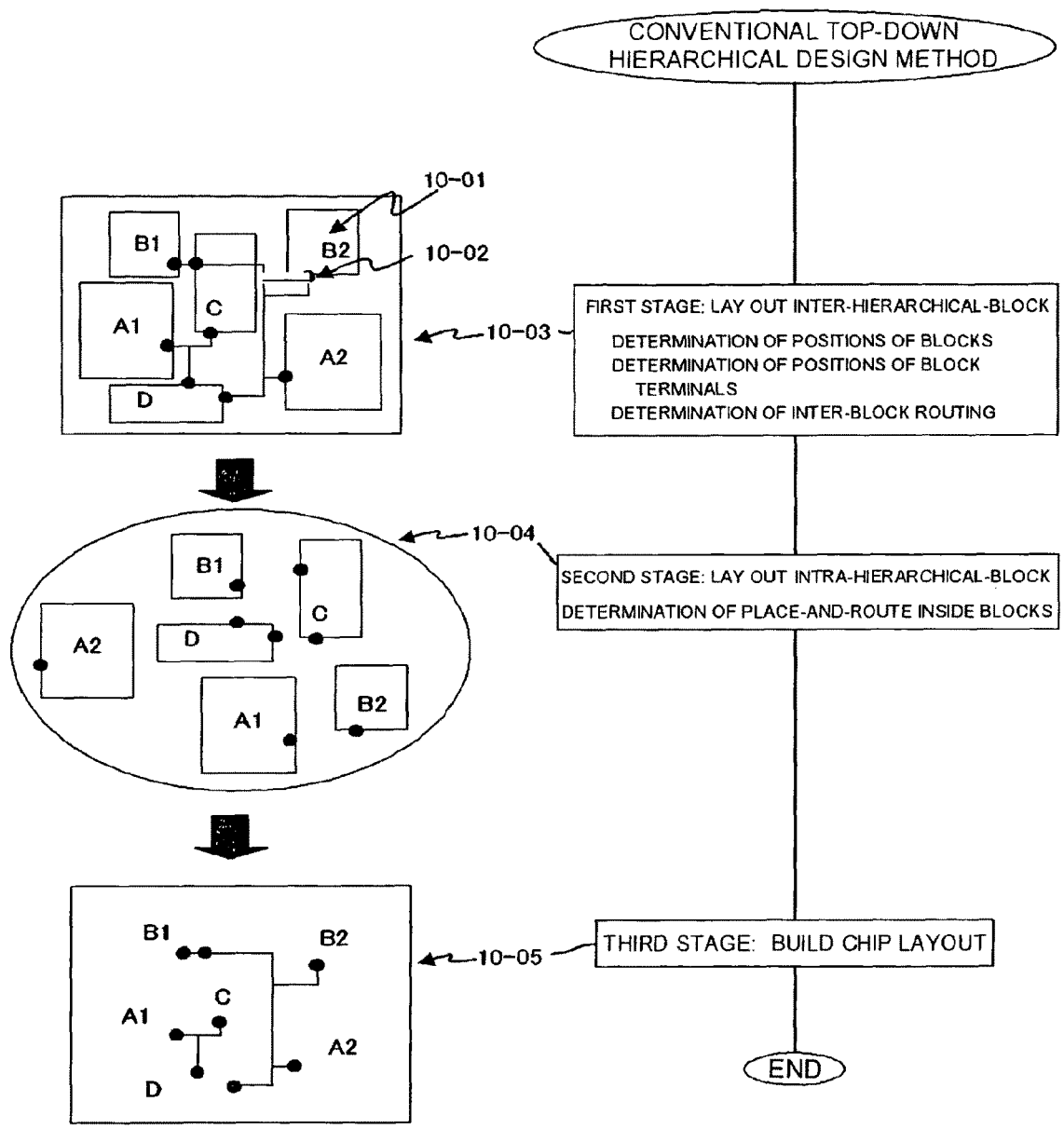
FIG. 10 is a drawing showing a top-down hierarchical design method, one of the conventional techniques.

The above-described operations are shown in FIG. 6 and FIG. 7.

In the hierarchical design method of a semiconductor integrated circuit of this exemplary embodiment, in the placing the terminals of the hierarchical blocks, coordinates of the terminals of the hierarchical blocks (final positions 6-07 of the block terminals) are determined, first by setting center coordinates of the individual hierarchical blocks or coordinates calculated based on results of temporary placement of the logic gates in the individual hierarchical blocks, to the initial positions 6-02 of the terminals of the hierarchical blocks, generating temporary routing among the hierarchical blocks (inter-hierarchical-block temporary routing 6-04), for connecting the initial positions (6-02) of the terminals of the hierarchical blocks, and by selecting points where the routes of the temporary routings (inter-hierarchical-block temporary routings 6-04) and the boundaries of the hierarchical block cross, as hierarchical block terminal positions 6-05.

In the hierarchical design method of a semiconductor integrated circuit of this exemplary embodiment, in the executing the intra-hierarchical-block layout design, coordinates of the terminals of the sets of hierarchical block having the same function are determined, first by determining temporary positions of the terminals of the hierarchical blocks (hierarchical block terminal positions 6-05), without considering a restriction such that coordinates of the corresponding terminals of the sets of hierarchical blocks having the same function necessarily coincide; next, determining barycenter coordinates of the corresponding terminal sets (barycenter of terminal 7-07) of the sets of hierarchical blocks having the same function, based on the coordinates of the temporary positions of the terminals of the hierarchical blocks 6-05, generating again the routes of the temporary routings (result of inter-hierarchical-block re-routing 6-06) so that the routes of the temporary routings (inter-hierarchical-block temporary routings 6-04) cross the boundaries of the hierarchical blocks at positions more closer to the barycentric coordinates; updating the temporary positions of the terminals of the hierarchical blocks; and repeating said generating the routes of the temporary routings and the updating of the temporary positions of the terminals of the hierarchical blocks, until coordinates of the corresponding terminals of the sets of hierarchical blocks having the same function coincide, and thereby determining final terminal positions (final block terminal positions 6-07).

First, as shown in FIG. 6(*a*), a routing lattice generating unit 5-01 sets a routing lattice 6-03 so as to cover the entire portion of the chip. The initial terminal position generating unit 5-02 then sets the center coordinates of the individual hierarchical blocks or coordinates calculated based on results of temporary placement of the logic gates in the individual hierarchical blocks, to the initial positions of the terminals of the hierarchical blocks (6-02). Next, in response to an interhierarchical-block connection request (6-01) shown in FIG. 6(*a*), on the routing lattice (6-03), as shown in FIG. 6(*b*), the route search unit 5-05 determines routes of the temporary routings (inter-hierarchical-block temporary routings 6-04) for connecting the initial positions of the terminals of the hierarchical blocks. Then, the provisional decision unit 5-06 for position of hierarchical block terminals sets temporary positions (6-05) of the terminals of the hierarchical blocks at the points where the obtained routes of the temporary routings and the boundaries of the hierarchical blocks cross. In the first route search herein, restrictions on the positions of the block terminals of the hierarchical blocks having the same function are not specifically set.

Next, with respect to the results, the sufficiency judging unit 5-07 regarding positional restriction of terminals of blocks having the same function inspects whether the corresponding block terminals of a plurality of hierarchical blocks having the same function are placed on the same positions on all of the same types of hierarchical blocks. In case of non-coincidence, the target terminal position setting unit 5-03 sets target positions of the terminals, and the route search unit 5-05 again executes the route search. In the example shown in FIG. 6(*b*), whether the terminal positions of the sets of hierarchical blocks A1 and A2, and the terminal positions of B1 and B2, respectively having the same functions, coincide with each other, and as a result of non-coincidence, the target terminal position setting unit 5-03 sets target positions of the terminals for A1, A2, B1 and B2, and the route search unit 5-05 again executes the route search. The target positions of the terminals herein are set as shown in FIG. 7, by determining To (terminal barycenter 7-07) between the terminal position (7-01) of B1 and the terminal position (7-03) of B2, and coordinate $T_0'$ (target terminal position 7-08) closest to $T_0$ is then set on the boundary of the block. In the drawing, 7-02 represents a routing drawn out from B1, and 7-04 represents a routing drawn out from B2.

In the route search in the second trial and thereafter, the route search is executed while setting difference between the position where the route crosses the block boundary, and target position of the terminal determined as described in the above, as a penalty. A larger value will be set to the penalty, as the number of times of route search increases, or as the difference between the target positions of the terminals and the terminal positions remains larger. Accordingly, in such repetitive route search shown in FIG. 5, positions of the corresponding block terminals of the hierarchical blocks having the same function move gradually towards coincidence. Finally, as shown in FIG. 6(*c*), upon coincidence of the positions of the terminals between the blocks A1 and A2, and blocks B1 and B2, the processing comes to the end.

The exemplary embodiments of the present invention have been described referring to the examples, wherein the present invention is by no means limited to the above-described examples. Any configurations and details of the present invention allow various modifications within the scope of the present invention, so far as those skilled in the art can understand them.

Also the exemplary embodiments below may be adoptable as the exemplary embodiments of the present invention.

(1) A hierarchical design method for a semiconductor integrated circuit, which includes:

placing sets of hierarchical blocks on a chip;

placing terminals of the hierarchical blocks so that for sets of hierarchical blocks having the same function, the hierarchical blocks coincide with each other in a coordinate of the corresponding terminal;

executing the individual types of intra-hierarchical-block layout designs, meanwhile executing only a single type of intra-hierarchical-block layout design of the sets of hierarchical blocks having the same function; and replicating thus-obtained layout patterns, and thereby completing a layout design over the entire chip.

(2) The hierarchical design method for a semiconductor integrated circuit as described in (1), wherein, after completion of an inter-hierarchical-block layout design, the individual types of intra-hierarchical-block layout designs are executed, and thereby completing the layout design over the entire chip.

(3) The hierarchical design method for a semiconductor integrated circuit as described in (1), wherein, after completion of the individual types of intra-hierarchical-block layout designs, an inter-hierarchical-block layout design is executed, and thereby completing the layout design over the entire chip.

(4) The hierarchical design method for a semiconductor integrated circuit as described in (1), wherein coordinates of the terminals of the hierarchical blocks are determined by a method which includes:

setting, at initial positions of the terminals of the hierarchical blocks, center coordinates of the individual hierarchical blocks or coordinates calculated based on results of temporary placement of logic gates in the individual hierarchical blocks;

generating temporary routings among the hierarchical blocks, so as to make connection among the individual initial positions of the terminals of the hierarchical blocks; and selecting points, where routes of the temporary routings cross the boundaries of the hierarchical blocks, as hierarchical block terminal positions.

(5) The hierarchical design method for a semiconductor integrated circuit as claimed in (4), wherein coordinates of terminals of the sets of hierarchical blocks having the same function are determined by a method which includes:

firstly, determining temporary positions of the terminals of the hierarchical blocks, without considering a restriction such that coordinates of the same terminals of the sets of hierarchical blocks having the same function necessarily coincide;

next, determining barycentric coordinate of the corresponding terminal sets of the sets of hierarchical blocks having the same function, based on the coordinates of the temporary positions of the terminals of the hierarchical blocks, and by generating again the routes of the temporary routings so that the routes of the temporary routings cross the boundaries of the hierarchical blocks at positions more closer to the barycentric coordinates;

updating the temporary positions of the terminals of the hierarchical blocks; and repeating the generating the routes of the temporary routings and the updating of the temporary positions of the terminals of the hierarchical blocks, until coordinates of the corresponding terminals of the sets of hierarchical blocks having the same function coincide, and thereby determining final terminal positions.

(6) A hierarchical design apparatus for a semiconductor integrated circuit, which includes:

a unit which places sets of hierarchical blocks onto a chip;

a unit which places terminals of the hierarchical blocks so that for sets of hierarchical blocks having the same function, said hierarchical blocks coincide with each other in a coordinate of the corresponding terminal;

a unit which executes the individual types of intra-hierarchical-block layout designs, meanwhile executes only a single type of intra-hierarchical-block layout design for the sets of hierarchical blocks having the same function; and a unit which replicates thus-obtained layout patterns, and thereby completing the layout design over the entire chip.

(7) The hierarchical design apparatus for a semiconductor integrated circuit as described in (6), which includes:

a unit which executes, after completion of an inter-hierarchical-block layout design, the individual types of intra-hierarchical-block layout designs, and thereby completing the layout design over the entire chip.

(8) The hierarchical design apparatus for a semiconductor integrated circuit as described in (6), which includes:

a unit which executes, after completion of the individual types of intra-hierarchical-block layout designs, an inter-hierarchical-block layout design, and thereby completing the layout design over the entire chip.

(9) The hierarchical design apparatus for a semiconductor integrated circuit as described in (6), wherein the unit which determines coordinates of the terminals of the hierarchical blocks includes:

a unit which sets, at initial positions of the terminals of the hierarchical blocks, center coordinates of the individual hierarchical blocks or coordinates calculated based on results of temporary placement of logic gates in the individual hierarchical blocks;

a unit which generates temporary routings among the hierarchical blocks, so as to make connection among the individual initial positions of the terminals of the hierarchical blocks; and a unit which selects points, where routes of the temporary routings cross the boundaries of the hierarchical blocks, as hierarchical block terminal positions.

(10) The hierarchical design apparatus for a semiconductor integrated circuit as described in (9), wherein the unit which determines coordinates of terminals of the sets of hierarchical blocks having the same function includes:

a unit which determines temporary positions of the terminals of the hierarchical blocks, without considering a restriction such that coordinates of the corresponding terminals of the sets of hierarchical blocks having the same function necessarily coincide;

a unit which updates the positions of the terminals of the hierarchical blocks by determining barycentric coordinates of the corresponding terminal sets of the sets of hierarchical blocks having the same function, based on the coordinates of the temporary positions of the terminals of the hierarchical blocks, and by generating again the routes of the temporary routings so that the routes of the temporary routings cross the boundaries of the hierarchical blocks at positions more closer to the barycentric coordinates; and a unit which allows the unit of determining routes of the temporary routings and the unit of updating the positions of the terminals of the hierarchical blocks to repeat, until coordinates of the corresponding terminals of the sets of hierarchical blocks having the same function coincide.

This application is based upon and claims the benefit of priority from Japanese patent application No. 2006-186550, filed on Jul. 6, 2006, the disclosure of which is incorporated herein in its entirety by reference.

The invention claimed is

1. A hierarchical design method for a semiconductor integrated circuit, wherein said hierarchical design method is stored on a non-transitory computer readable medium and performed by a hierarchical design apparatus for said semiconductor integrated circuit, said method comprising:

placing sets of hierarchical blocks on a chip design, by the hierarchical design apparatus;

placing terminals of said hierarchical blocks, by the hierarchical design apparatus, so that for sets of hierarchical blocks having the same function, said hierarchical blocks coincide with each other in a coordinate of the corresponding terminal;

executing individual types of intra-hierarchical-block layout designs, meanwhile executing only a single type of intra-hierarchical-block layout design for said sets of hierarchical blocks having the same function, by a processor of said hierarchical design apparatus to obtain layout design patterns; and replicating the obtained layout design patterns, and thereby completing a layout design over the entire chip, by the hierarchical design apparatus, wherein the placing of said terminals of said hierarchical blocks to determine coordinates of said terminals of said hierarchical blocks, comprises:

firstly, setting, at initial positions of said terminals of said hierarchical blocks, center coordinates of said individual hierarchical blocks or coordinates calculated based on results of temporary placement of logic gates in said individual hierarchical blocks;

generating temporary routings among said hierarchical blocks, so as to make connection among said individual initial positions of said terminals of said hierarchical blocks; and selecting points, where routes of said temporary routings cross boundaries of said hierarchical blocks, as hierarchical block terminal positions, wherein the executing of the individual types of intra-hierarchical-block layout designs to determine coordinates of terminals of said sets of hierarchical blocks having a same function, comprises:

firstly, determining temporary positions of said terminals of said hierarchical blocks, without considering a restriction such that coordinates of corresponding terminals of said sets of hierarchical blocks having the same function necessarily coincide;

next, determining barycentric coordinates of the corresponding terminal sets of said sets of hierarchical blocks having the same function, based on coordinates of said temporary positions of said terminals of said hierarchical blocks after the determining of the temporary positions of said terminals of said hierarchical blocks;

generating again routes of said temporary routings so that said routes of said temporary routings cross the boundaries of said hierarchical blocks at positions closer to said barycentric coordinates;

updating the temporary positions of said terminals of said hierarchical blocks; and repeating said generating said routes of said temporary routings and said updating of said temporary positions of said terminals of said hierarchical blocks, until coordinates of the corresponding terminals of said sets of hierarchical blocks having the same function coincide, and thereby determining final terminal positions, wherein the placing of the terminals of said hierarchical blocks, performed by said hierarchical design apparatus, comprises:

(a) setting, at initial positions of said terminals of said hierarchical blocks, center coordinates of said individual hierarchical blocks or coordinates calculated based on results of temporary placement of logic gates in said individual hierarchical blocks;

(b) setting, based on latest results of placement of the terminals, target positions of the of terminals;

(c) settings in a route search in a second trial and thereafter, a penalty given corresponding to a distance between determined terminal positions and the target positions of the terminals, while the processing of the placing terminals of said hierarchical blocks is repeated until positions of the same terminals of the same functional blocks coincide, a larger value being set to the penalty, as a number of times of repetition increases, or as a difference between the target positions of the terminals and the terminal positions remains larger;

(d) moving said initial terminal position to an intersection of a lattice closest to the position determined in step (a), searching a path between terminals along a routing lattice, and executing the route search in this process of route searching for a net to be connected to the same terminals of the hierarchical blocks having the same function, while considering the penalty set in step (c), so that a route of interconnect crosses a block boundary at a position closer to said target position of the terminal set in step (b); and (e) temporarily determining, as block terminal positions, points where the routes determined in step (d) cross the boundaries of the hierarchical blocks.

2. The hierarchical design method for a semiconductor integrated circuit as set forth in claim 1, in which said hierarchical design apparatus performs executing said individual types of intra-hierarchical-block layout designs after a completion of an inter-hierarchical-block layout design, and thereby completing a layout design over the entire chip.

3. The hierarchical design method for a semiconductor integrated circuit as set forth in claim 1, in which said hierarchical design apparatus performs executing an inter-hierarchical-block layout design after completion of said individual types of intra-hierarchical-block layout designs, and thereby completing the layout design over the entire chip.

4. The hierarchical design method for a semiconductor integrated circuit as set forth in claim 1, wherein the placing of the terminals of said hierarchical blocks, performed by said hierarchical design apparatus, comprises:

(f) judging, with respect to the terminal positions determined in step (e), and with respect to a plurality of hierarchical blocks having the same functions, a sufficiency regarding positional restriction of terminals of blocks sets having the same function, based on whether the corresponding terminals of the blocks are placed at same positions on all of same types of hierarchical blocks, or not;

(g) setting, when the corresponding terminals of the blocks were consequently judged as being not placed at the same position, the target positions of the terminals and a route search cost again, and determining, by an inter-block route search, the block terminal positions, said route search cost being composed of said penalty for making a coincidence of the same terminals of blocks having the same function, and a length-of-route cost for minimizing a length of route, the length-of-route cost being set larger as the length of route increases, wherein steps (b) to (g) are repeated until the terminal positions of the same types of hierarchical blocks coincide, and upon coincidence of the terminal positions of the same types of the hierarchical blocks, the step of placing terminals of said hierarchical blocks comes to the end.

5. A hierarchical design apparatus for a semiconductor integrated circuit, said apparatus comprising:

a unit which places sets of hierarchical blocks onto a chip design;

a unit which places terminals of said hierarchical blocks so that for sets of hierarchical blocks having a same function, said hierarchical blocks coincide with each other in a coordinate of a corresponding terminal;

a unit which executes individual types of intra-hierarchical-block layout designs, meanwhile executing only a single type of intra- hierarchical-block layout design for said sets of hierarchical blocks having the same function; and a unit which replicates obtained layout patterns from the unit which executes the individual types of intra-hierarchical-block layout designs, thereby completing a layout design over an entire chip, wherein said unit which places terminals of said hierarchical blocks comprises:

a unit which sets, at initial positions of said terminals of said hierarchical blocks, center coordinates of said individual hierarchical blocks or coordinates calculated based on results of temporary placement of logic gates in said individual hierarchical blocks;

a unit which generates temporary routings among said hierarchical blocks, so as to make connections among said individual initial positions of said terminals of said hierarchical blocks; and a unit which selects points, where routes of said temporary routings cross boundaries of said hierarchical blocks, as hierarchical block terminal positions, so as to determine coordinates of said terminals of said hierarchical blocks, wherein, said unit which executes the intra-hierarchical-block layout design comprises:

a unit which firstly, determines temporary positions of said terminals of said hierarchical blocks, without considering a restriction such that coordinates of corresponding terminals of said sets of hierarchical blocks having the same function necessarily coincide;

a unit which updates positions of said terminals of said hierarchical blocks by next, determining barycentric coordinates of corresponding terminal sets of said sets of hierarchical blocks having the same function, based on coordinates of said temporary positions of said terminals of said hierarchical blocks, and by generating again routes of said temporary routings so that said routes of said temporary routings cross the boundaries of said hierarchical blocks at positions closer to said barycentric coordinates; and a unit which allows said unit of updating to repeat a generation of the routes of said temporary routing and updating of said temporary positions of said terminals of said hierarchical blocks until coordinates of the corresponding terminals of said sets of hierarchical blocks having the same function coincide, and thereby determining final terminal positions, so as to determine coordinates of said terminals of said sets of hierarchical blocks having the same function, wherein said unit which places terminals of said hierarchical blocks comprises:

an initial terminal position generating unit which sets, at initial terminal positions, center coordinates of the individual hierarchical blocks or coordinates calculated based on results of temporary placement of logic gates in the hierarchical blocks;

a target terminal position setting unit which sets target terminal positions based on latest results of placement of the terminals;

a route search cost setting unit which sets, in a route search in a second trial and thereafter, a penalty given corresponding to a distance between the determined terminal positions and the target terminal positions, a larger value being set to the penalty as the number of times of repetition increases, or as a difference between the target terminal positions and the terminal positions remains larger when a processing of said unit which places terminals of said hierarchical blocks is repeated until positions of the same terminal of the same functional blocks coincide;

a route search unit which moves said initial terminal position to an intersection of a lattice closest to a position determined by the initial terminal position generating unit, searches a path between the terminals along a routing lattice, and executes a route search in this process of route searching for a net to be connected to the same terminals of the hierarchical blocks having the same function, while considering the penalty set by said route search cost setting unit, so that the route of interconnect crosses the block boundary at a position closer to the target terminal position set by said target terminal position setting unit; and a provisional decision unit for position of hierarchical block terminals which temporarily determines, as block terminal positions, points where the routes determined by said route search unit cross the boundaries of the hierarchical blocks.

6. The hierarchical design apparatus for a semiconductor integrated circuit as set forth in claim 5, comprising:

a unit which executes, after a completion of an inter-hierarchical-block layout design, said individual types of intra-hierarchical-block layout designs, and thereby completing the layout design over the entire chip.

7. The hierarchical design apparatus for a semiconductor integrated circuit as set forth in claim 5, comprising:

a unit which executes, after a completion of said individual types of intra-hierarchical-block layout designs, an inter-hierarchical-block layout design, and thereby completing the layout design over the entire chip.

8. The hierarchical design apparatus for a semiconductor integrated circuit as set forth in claim 5, wherein said unit which places terminals of said hierarchical blocks further comprises:

a sufficiency judging unit regarding positional restriction of terminals of blocks having the same function which judges, with respect to the terminal positions determined by said provisional decision unit for position of hierarchical block terminals, and with respect to a plurality of hierarchical blocks having the same function, whether the corresponding terminals of the blocks are placed at same positions on all of same types of hierarchical blocks, or not, wherein when the corresponding terminals of the blocks are consequently judged as being not placed at the same position, the target terminal positions and route search cost are set again, and the block terminal positions are determined by an inter-block route search;

said route search cost being composed of said penalty for making coincidence of the same terminals of the blocks having the same function and a length-of-route cost for minimizing a length of route, the length-of-route cost being set larger as the length of route increases, wherein the processing in said unit which places terminals of said hierarchical blocks is repeated until the terminal positions of the same types of hierarchical blocks coincide, and upon coincidence of the terminal positions of the same types of the hierarchical blocks, the processing of said unit which places terminals of said hierarchical blocks ends.

9. A hierarchical design apparatus for a semiconductor integrated circuit, comprising:

means for placing sets of hierarchical blocks onto a chip design;

means for placing terminals of said hierarchical blocks so that for sets of hierarchical blocks having the same function, said hierarchical blocks coincide with each other in a coordinate of a corresponding terminal;

means for executing individual types of intra-hierarchical-block layout designs, meanwhile executing only a single type of intra-hierarchical-block layout design for said sets of hierarchical blocks having the same function; and means for replicating obtained layout patterns from the means for executing the individual types of intra-hierarchical-block layout designs, thereby completing a layout design over an entire chip, wherein said means for placing terminals of said hierarchical blocks comprises:

a unit which sets, at initial positions of said terminals of said hierarchical blocks, center coordinates of said individual hierarchical blocks or coordinates calculated based on results of temporary placement of logic gates in said individual hierarchical blocks;

a unit which generates temporary routings among said hierarchical blocks, so as to make connection, among said individual initial positions of said terminals of said hierarchical blocks; and a unit which selects points, where routes of said temporary routings cross boundaries of said hierarchical blocks, as hierarchical block terminal positions, so as to determine coordinates of said terminals of said hierarchical blocks, wherein, said means for executing the intra-hierarchical-block layout design comprises:

a unit which, firstly, determines temporary positions of said terminals of said hierarchical blocks, without considering a restriction such that coordinates of corresponding terminals of said sets of hierarchical blocks having the same function necessarily coincide;

a unit which updates the positions of said terminals of said hierarchical blocks by, next, determining barycentric coordinates of the corresponding terminal sets of said sets of hierarchical blocks having the same function, based on coordinates of said temporary positions of said terminals of said hierarchical blocks, and by generating again the routes of said temporary routings so that said routes of said temporary routings cross the boundaries of said hierarchical blocks at positions closer to said barycentric coordinates; and a unit which allows said unit of updating to repeat generation of the routes of said temporary routing and updating of said temporary positions of said terminals of said hierarchical blocks, until coordinates of the corresponding terminals of said sets of hierarchical blocks having the same function coincide, and thereby determining final terminal positions, so as to determine coordinates of said terminals of said sets of hierarchical blocks having the same function, wherein said means for placing terminals of said hierarchical blocks comprises:

an initial terminal position generating unit which sets, at initial terminal positions, center coordinates of the individual hierarchical blocks or coordinates calculated based on results of temporary placement of logic gates in the hierarchical blocks;

a target terminal position setting unit which sets target term based on latest results of placement of the terminals;

a route search cost setting unit which sets, in a route search in a second trial and thereafter, a penalty given corresponding to a distance between the determined terminal positions and the target terminal positions, a larger value being set to the penalty as the number of times of repetition increases, or as a difference between the target terminal positions and the terminal positions remains larger when a processing of said unit which places terminals of said hierarchical blocks is repeated until positions of the same terminal of the same functional blocks coincide;

a route search unit which moves said initial terminal position to an intersection of a lattice closest to a position determined by the initial terminal position generating unit, searches a path between the terminals along a routing lattice, and executes a route search in this process of route searching for a net to be connected to the same terminals of the hierarchical blocks having the same function, while considering the penalty set by said route search cost setting unit, so that the route of interconnect crosses the block boundary at a position closer to the target terminal position set by said target terminal position setting unit; and a provisional decision unit for position of hierarchical block terminals which temporarily determines, as block terminal positions, points where the routes determined by said route search unit cross the boundaries of the hierarchical blocks.

* * * * *